United States Patent [19]
Barnes et al.

[11] Patent Number: 5,207,437
[45] Date of Patent: May 4, 1993

[54] CERAMIC ELECTROSTATIC WAFER CHUCK

[75] Inventors: Michael S. Barnes, Mahopac; Dennis K. Coultas, Hopewell Junction; John C. Forster, Poughkeepsie; John H. Keller, Newburgh, all of N.Y.

[73] Assignee: International Business Machines Corporation, Armonk, N.Y.

[21] Appl. No.: 784,291

[22] Filed: Oct. 29, 1991

[51] Int. Cl.$^5$ ............................................. H01F 13/02
[52] U.S. Cl. ........................................ 279/128; 269/8; 361/234
[58] Field of Search ............. 361/234, 233, 230; 279/128; 269/8; 74/262

[56] References Cited

U.S. PATENT DOCUMENTS

| | | | |
|---|---|---|---|
| 3,571,678 | 3/1971 | Sezako | 361/234 |
| 3,916,270 | 10/1975 | Wachtler et al. | 361/234 |
| 4,257,083 | 3/1981 | Blyth | 361/234 |
| 4,426,654 | 1/1984 | Tarumi et al. | 361/230 X |
| 4,554,611 | 11/1985 | Lewin | 361/234 |
| 4,645,218 | 2/1987 | Ooshio et al. | 279/128 |
| 4,665,463 | 5/1987 | Ward et al. | 361/234 |
| 4,751,609 | 6/1988 | Kasahara | 361/234 |
| 4,803,595 | 2/1989 | Kraus et al. | 174/262 X |
| 4,897,171 | 1/1990 | Ohmi | 118/500 |
| 4,975,802 | 12/1990 | Kasahara | 361/234 X |
| 5,047,892 | 9/1991 | Sahata et al. | 361/231 |
| 5,055,964 | 10/1991 | Logan et al. | 279/128 X |

FOREIGN PATENT DOCUMENTS

| | | | |
|---|---|---|---|
| 0360529 | 3/1990 | European Pat. Off. | |
| 196211 | 12/1982 | Japan | 361/234 |
| 264638 | 11/1987 | Japan | |
| 295141 | 12/1988 | Japan | 269/8 |
| 454654 | 2/1975 | U.S.S.R. | 269/8 |
| 1043298 | 9/1966 | United Kingdom | 361/234 |

Primary Examiner—Steven C. Bishop
Attorney, Agent, or Firm—Whitham & Marhoefer

[57] ABSTRACT

An electrostatic chuck for semiconductor wafers comprised of a multilayered ceramic, including a back-side-metal layer pattern adjacent the upper wafer receiving surface for generating an electrostatic force. Intermediate via layers connect the pattern to a back-side-metal layer at the bottom of the chuck to which power leads can be connected. A number of small passages, extending from the bottom of the chuck to its upper surface, allow helium heat transfer without the need for surface grooves.

7 Claims, 2 Drawing Sheets

CERAMIC ELECTROSTATIC WAFER CHUCK

BACKGROUND OF THE INVENTION

1. Field of the Invention

The present invention generally relates to an electrostatic chuck for semiconductor wafers, and more particularly to an improved chuck that can operate over a broad range of temperatures and pressures.

2. Description of the Prior Art

Electrostatic chuck technology is vital to the future of semiconductor plasma processing. Such chucks eliminate the need for mechanical clamping devices for holding the semiconductor wafer; devices which are clumsy and can introduce contamination into the processing chambers.

There have been a number of prior art proposals for electrostatic chuck designs, including the following:

Japanese Patent No. 62-264638 to Toto Ltd., discloses a conductor layer and an insulating film made of ceramics capable of plastic deformation that are successively piled on a ceramics green sheet to form a piled material. Then, this piled material is fired to obtain an electrostatic chucking substrate.

U.S. Pat. No. 4,645,218 to Ooshio et al., discloses an electrostatic chuck with channels for passing a cooling medium through the body of the chuck.

U.S. Pat. No. 4,897,171 to Ohmi, discloses a wafer susceptor which has a first conductive electrode including a flat surface covered with a thin insulating film and a second conductive electrode which is electrically insulated from the first conductive electrode and is disposed so that a surface thereof is flush with the surface of the thin insulating film which covers the first conductive electrode European Patent No. 0360529 to Toto Ltd., discloses an electrostatic chuck with at least two layers, each including an electrically insulating film and an electrode attached to a lower surface thereof and at least two layers being disposed as attractive layers on the base plate. A voltage applying assembly selectively applies a voltage to at least one of the electrodes to electrostatically attract the object to the insulating film of an uppermost one of the layers.

In general, prior art electrostatic chuck designs have not been altogether satisfactory in their operation, particularly when judged on their ability to operate over broad temperature and pressure ranges extending down to cryogenic temperatures.

SUMMARY OF THE INVENTION

It is therefore an object of the present invention to provide an electrostatic chuck that can operate over broad temperature and pressure ranges; one that is economical to manufacture and one that can operate in either single or dual potential modes.

Briefly, this invention contemplates the provision of an electrostatic chuck for semiconductor wafers comprised of a fused multilayered ceramic, including a back-side-metal layer pattern adjacent the upper wafer receiving surface for generating an electrostatic force. Intermediate via layers connect the pattern to a back-side-metal layer at the bottom of the chuck to which power leads can be connected. A number of small passages, extending from the bottom of the chuck to its upper surface, allow helium heat transfer without the need for surface grooves. Additional via patterns may be provided, if desired, to increase the thermal conductivity of the chuck. The pattern adjacent the wafer receiving surface may be formed to provide for dual polarity as well as single polarity operation with via metalization to accommodate either operation. In the preferred embodiment of the invention the materials and process technologies used to fabricate the chuck are the same as those commonly used to fabricate multilayer ceramic semiconductor modules; for example, so-called "green sheet" ceramic layers are used.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
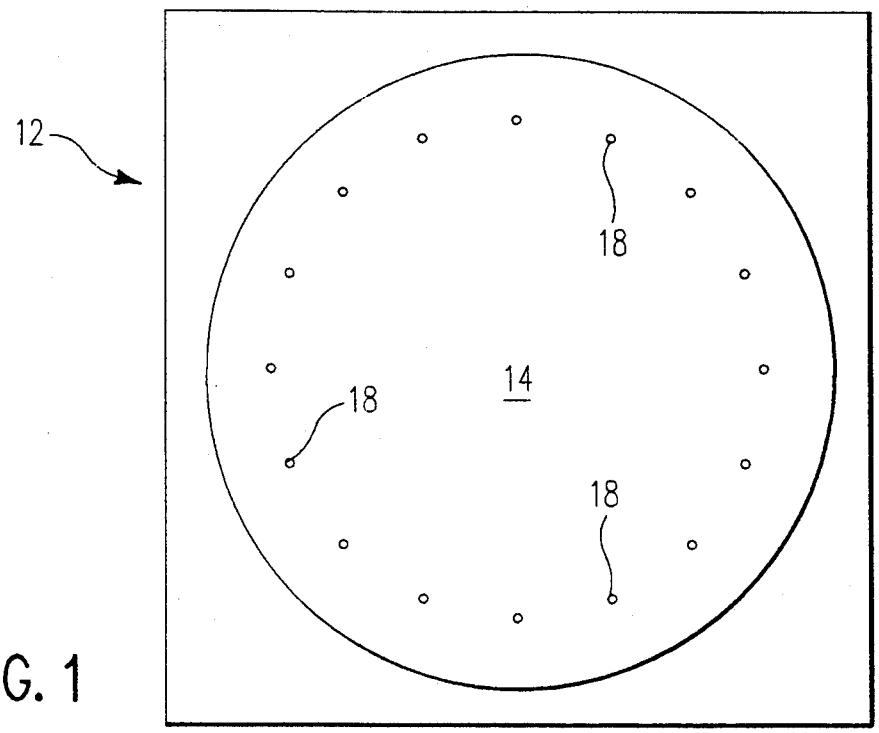
FIG. 1 is a top plan view of one embodiment of an electrostatic chuck in accordance with the teachings of this invention.
Figure 1A:
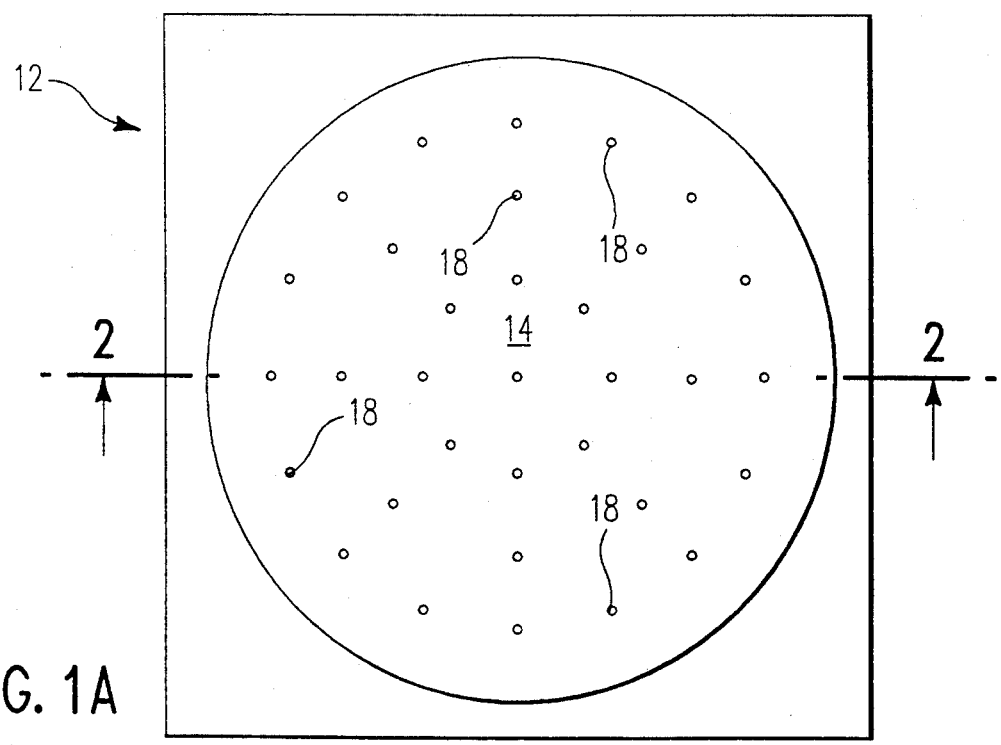
FIG. 1A is a view similar to FIG. 1 of another embodiment of the invention.
Figure 2:
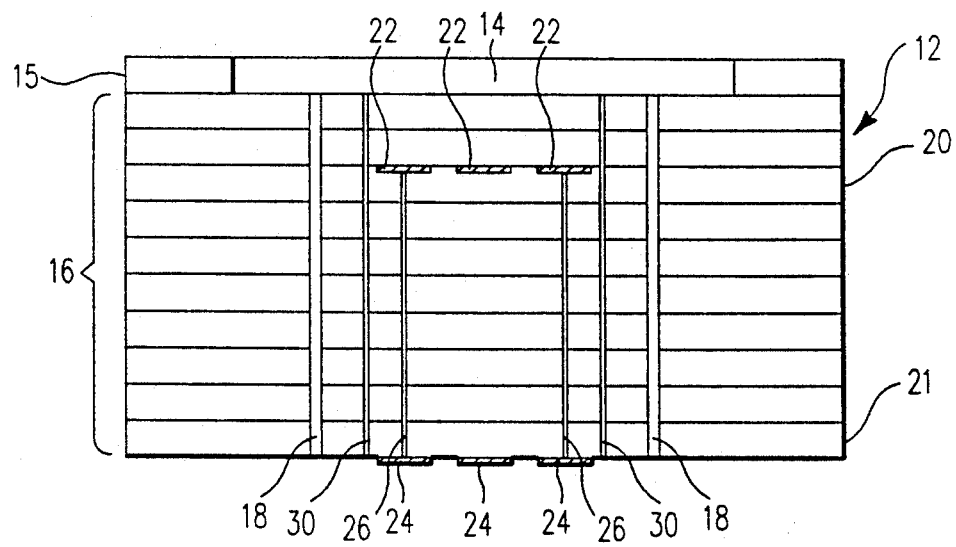
FIG. 2 is a sectional view along the line 2—2 in FIG. 1.
Figure 3:
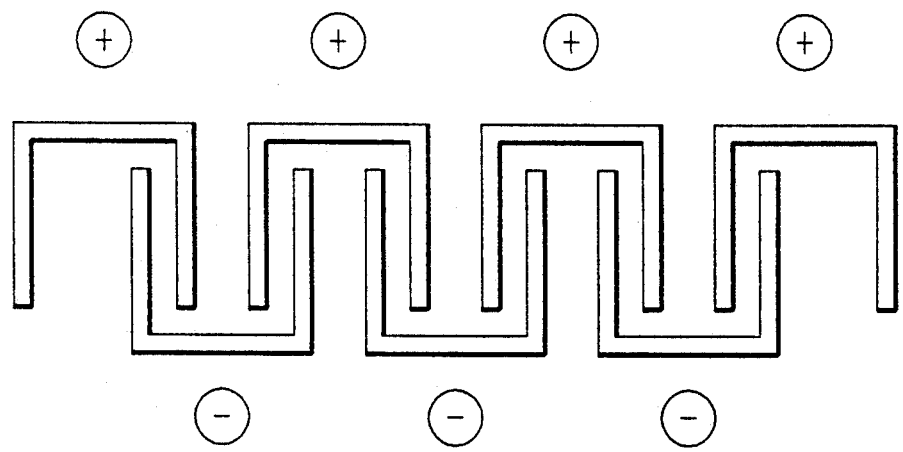
FIG. 3 is a plan view of one embodiment of a conductive pattern for generating an electrostatic attracting force in accordance with the teachings of this invention.

Referring now to FIGS. 1, 1A, and 2, the chuck is comprised of thin ceramic or glass sheets which have been built up and then fused to form a solid dielectric block indicated by the general reference number 12. A laminate sheet or sheets 15 form a pocket or recess around the top surface 14 against which a semiconductor wafer is held by the chuck. It should be noted that FIG. 3 is not to scale and detail has been omitted for illustrative clarity. Typically, the chuck is on the order of ¼-inch in height.

Individual laminate sheets 16 from which the chuck is built are comprised of a ceramic material such as ceramic formed from 92% alumina combined with 8% $SiO_2$ (i.e., laminates known in the art as "green sheets") or a glass ceramic. It should be noted that these materials and the process steps for building the chuck are the same as those commonly used for fabricating wiring and via layers for a semiconductor module.

Channels 18 extend from the lower surface of the chuck to its upper surface, to allow a coolant, such as helium, to be brought to the surface of the semiconductor wafer in contact with the surface of the chuck. The channels 18 may be in a circular pattern, as shown in FIG. 1, or may be distributed over the entire upper surface of the chuck, as shown in FIG. 2. The channels 18 are typically on the order of 40 thousandths of an inch in diameter and may be formed by aligning small apertures formed in each of the laminates.

Figure 4:
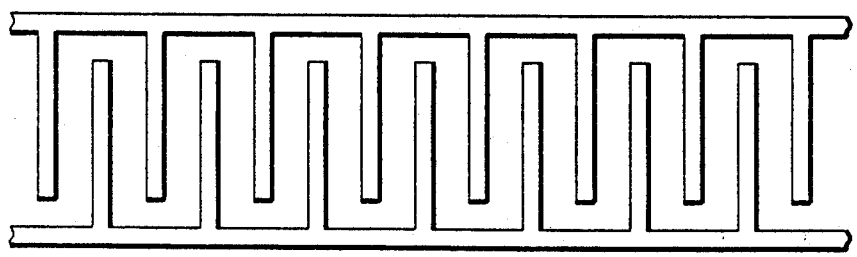
FIG. 4 is a view similar to FIG. 4 of an alternate pattern.

A laminate 20 adjacent surface 14 and a laminate 21 at the bottom are back-side-metal (BSM) green sheets, and the intermediate layers may be blank green sheets except for via connections and cooling studs, if any. A BSM pattern 22 on the laminate 20 generates an electrostatic force to attract the semiconductor wafer to the chuck, and a BSM pattern 24 on the bottom laminate is adapted to be connected to an external power source; it provides an interface between the power source and vias 26 that connect power to the pattern 22. The patterns 22 and 24 can be comprised of titanium or tantalum paste of the type used in combination with green sheets and ceramic wiring packages for semiconductor modules. As shown in FIG. 3, the pattern 22 may be in a form similar in appearance to that of overlapping tuning forks. If one set of "forks" is connected to one potential and the set coupled to an opposite potential, the chuck operates in a dual potential mode. Connecting both sets to a single potential provides single potential operation. Suitable metalization and vias can be formed to permit either mode of operation. FIG. 4 illustrates another pattern for generating an electrostatic force; here, the pattern resembles in appearance, two "combs" with their teeth interleaved.

If desired, additional via chains can be formed in the chuck, such as chains 30 to transfer heat from the wafer. Chains 30 extend from the upper surface of the top laminate to the bottom surface of the bottom laminate. Further, it desired, a resistive heating element can be formed on one laminate and connected by vias to connection pads in pattern 24.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electrostatic chuck for holding semiconductor wafers against a top surface of said chuck, comprising in combination:

a plurality of laminates fused together to form a support body, one of said laminates disposed adjacent said top surface having a back-side-metal electrode pattern for generating an electrostatic force to hold said semiconductor wafer to said top surface, and another of said laminates having a back-side-metal pattern on an exterior surface of said support body for connection to a power source;

a plurality of vias formed in said laminates electrically connecting said pattern for generating an electrostatic force to said pattern for connection to a power source; and a plurality of apertures formed in said laminates and aligned in said fused support body to form a passage for a fluid coolant, said passage extending from said exterior surface to said top surface.

2. An electrostatic chuck as in claim 1, wherein said back-side-metal electrode pattern for generating an electrostatic force comprises sets of interleaved "U"-shaped conductors.

3. An electrostatic chuck as in claim 1, wherein said back-side-metal electrode pattern for generating an electrostatic force comprises sets of interleaved comb-shaped conductors.

4. An electrostatic chuck as in claim 2, wherein said back-side-metal electrode pattern on an exterior surface of said support body and said plurality of vias connect said sets of "U"-shaped conductors to a potential of one polarity.

5. An electrostatic chuck as in claim 2, wherein said back-side-metal electrode pattern on an exterior surface of said support body and said plurality of vias connect one of said "U"-shaped conductors of said set to a potential of one polarity and the other of said "U"-shaped conductor of said set to a potential of opposite polarity.

6. An electrostatic chuck as in claim 3, wherein said back-side-metal electrode pattern on an exterior surface of said support body and said plurality of vias connect said sets of comb-shaped conductors to a potential of one polarity.

7. An electrostatic chuck as in claim 3, wherein said back-side-metal electrode pattern on an exterior surface of said support body and said plurality of vias conenct one of said sets of comb-shaped conductors to a potential of one polarity and the other of said sets to a potential of opposite polarity.

* * * * *